(12) United States Patent
Kim et al.

(10) Patent No.: US 8,785,903 B2
(45) Date of Patent: Jul. 22, 2014

(54) MEMORY CELL ARRAY AND VARIABLE RESISTIVE MEMORY DEVICE INCLUDING THE SAME

(75) Inventors: Sung Cheoul Kim, Icheon-si (KR);
Kang Sik Choi, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 140 days.

(21) Appl. No.: 13/601,778

(22) Filed: Aug. 31, 2012

(65) Prior Publication Data
US 2013/0313511 A1   Nov. 28, 2013

(30) Foreign Application Priority Data
May 24, 2012   (KR) .................. 10-2012-0055455

(51) Int. Cl.
*H01L 29/06*   (2006.01)
(52) U.S. Cl.
USPC ........ 257/5; 257/296; 257/328; 257/E45.002; 438/900

(58) Field of Classification Search
CPC ................... H01L 25/04; H01L 45/00
USPC .......... 257/2–5, 296, 328, 329, 401, E29.118, 257/E27.103, E45.002; 438/900
See application file for complete search history.

(56) References Cited

U.S. PATENT DOCUMENTS
2010/0295009 A1   11/2010   Lung et al.

FOREIGN PATENT DOCUMENTS
KR   1020090007397   1/2009

*Primary Examiner* — Mark A Laurenzi
(74) *Attorney, Agent, or Firm* — IP & T Group LLP

(57) ABSTRACT

A memory cell array and a resistive variable memory device including the memory cell array are provided. The memory cell array includes a memory group. The memory cell array includes a pair of word lines, an inter-pattern insulating layer interposed between the pair of word lines, and a plurality of active pillars, each having one side contacted with the inter-pattern insulating layer and other sides surrounded by the word line.

20 Claims, 4 Drawing Sheets

MEMORY CELL ARRAY AND VARIABLE RESISTIVE MEMORY DEVICE INCLUDING THE SAME

CROSS-REFERENCES TO RELATED APPLICATION

The present application claims priority under 35 U.S.C. 119(a) to Korean application number 10-2012-0055455, filed on May 24, 2012, in the Korean Patent Office, which is incorporated by reference in its entirety.

BACKGROUND OF THE INVENTION

1. Technical Field

The inventive concept relates to a semiconductor device, and more particularly, to a variable resistive memory device including a memory cell array.

2. Related Art

Portable digital apparatuses have been spread day by day. Ultra-high integration, ultra-high speed, and ultra-low power consumption are required to memory devices embedded in the portable digital apparatuses for processing large-capacity data with higher speed, although the memory devices have a limited size.

To meet the demands, vertical memory devices have been actively researched. Three-dimensional (3D) vertical gate structures have been applied to resistive memory devices which are considered as one of next-generation memory devices.

The resistive memory devices are configured to select a cell through an access device and change a resistance of a data storage material electrically connected to the access device to store data. As the resistive memory devices, there are phase-change memory devices, resistive memory devices, magnetoresistive memory devices, and the like.

The resistive memory device may employ a diode or a transistor as the access device. In particular, the thresh voltage of the transistor may be lowered as compared with the diode. Thus, the transistor can reduce an operation voltage. As the transistor can be fabricated in a vertical structure, the transistor has received attention again as the access device of the resistive memory device.

That is, since a voltage of 1.1 V or more has to be applied to the diode, there is a limit to lower the operation voltage. Further, when the diode is formed on the word line, resistance of the word line is changed according to positions of cells. Thus, a word line bouncing issue occurs.

Since the transistor generally has a horizontal structure in the related art, there is a limit to increase an integration degree of device. However, unlike a horizontal structure, the vertical transistor may sufficiently ensure current drivability in the limited channel area.

FIG. 1 is a layout diagram schematically illustrating a general 3D variable resistive memory device.

Referring to FIG. 1, a plurality of active pillars 20 are regularly arranged on a semiconductor substrate in a row and column directions. The active pillars 20 are configured to have a line width of 1 F (minimum feature size) in width and length. The active pillars 20 are arranged to have a distance of 0.5 F in a column direction and a distance of 1.5 F in a row direction. A word line 30 is arranged on active pillars 20 positioned in the same column. The word line 30 may be arranged to entirely surround the active pillar 20 to have a line width of 2 F. Further, the word line 30 may be spaced by an interval of 0.5 F to be insulated from an adjacent word line 30.

As shown in FIGS. 2 and 3, the word line 30 is arranged between the active pillars 20 in the column direction and the word lines 30 are spaced from each other by a distance S in the column direction. Here, the reference numeral 10 denotes a semiconductor substrate, and the reference numeral 15 denotes a common source electrode.

In the related art, the active pillars 20 are arranged to be surrounded by the word line 30. Thus, the distance between the active pillars 20 may be reduced in an extension direction of the word line. However, there may be still a limit to reduce the distance between the active pillars in the row direction.

SUMMARY

According to one aspect of an exemplary embodiment, there is a provided a variable resistive memory device. The variable resistive memory device may include a memory group. The memory cell array may include: a pair of word lines; an inter-pattern insulating layer interposed between the pair of word lines; and a plurality of active pillars, each having one side contacted with the inter-pattern insulating layer and other sides surrounded by the word line.

According to another aspect of an exemplary embodiment, there is a provided a memory cell array. The memory cell array may include: a first memory group including a first word line, a second word line adjacent to the first word line and extending parallel to the first word line, a first inter-pattern insulating layer interposed between the first and second word lines, a plurality of first active pillars arranged between the first word line and the first inter-pattern insulating layer in a first rule, and a plurality of second active pillars formed between the second word line and the first inter-pattern insulating layer in the first rule to correspond to the plurality of first active pillars; and a second memory group including a third word line adjacent to the second word line and extending parallel to the second word line, a fourth word line adjacent to the third word line and extending parallel to the third word line, a second inter-pattern insulating layer interposed between the third and fourth word lines, a plurality of third active pillars arranged between the third word line and the second inter-pattern insulating layer in the first rule, and a plurality of fourth active pillars formed between the fourth word line and the second inter-pattern insulating layer in the first rule to correspond to the plurality of third active pillars.

According to another aspect of an exemplary embodiment, a variable resistive memory device may include a first word line formed on a semiconductor substrate; a second word line formed on the semiconductor substrate, arranged in a direction parallel to the first word line, and spaced from the first word line by a first length corresponding to a half of critical dimension; an interlineinter-pattern insulating layer between the first and second word lines; a plurality of first active pillars surrounded by the first word line and the inter-pattern insulating layer, and arranged at intervals of the first length; a plurality of second active pillars surrounded by the second word line and the inter-pattern insulating layer, and arranged at intervals of the first length to correspond to the plurality of first active pillars; and a plurality of variable resistive bodies arranged on the pluralities of the first and second active pillars and electrically connected to the first and second active pillars.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
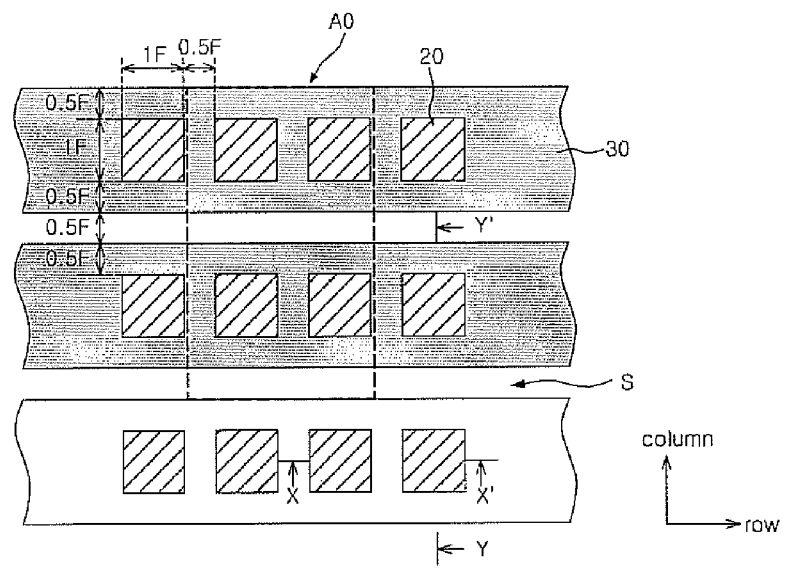
FIG. 1 is a layout diagram schematically illustrating a memory cell array structure of a general variable resistive memory device.
Figure 2:
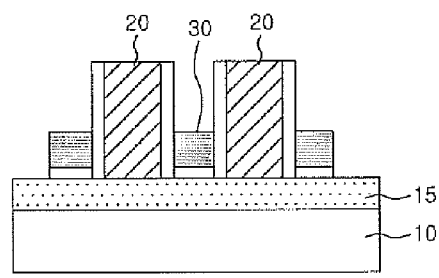
FIG. 2 is a cross-sectional view of the memory cell array taken along a line X-X' shown in FIG. 1.
Figure 3:
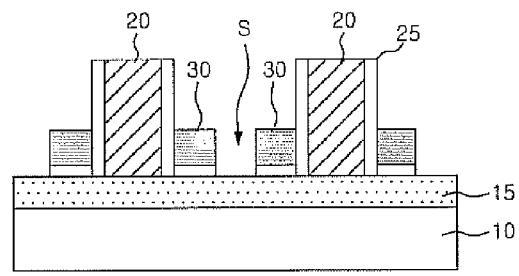
FIG. 3 is a cross-sectional view of the memory cell array taken along a line Y-Y' shown in FIG. 1.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 4:
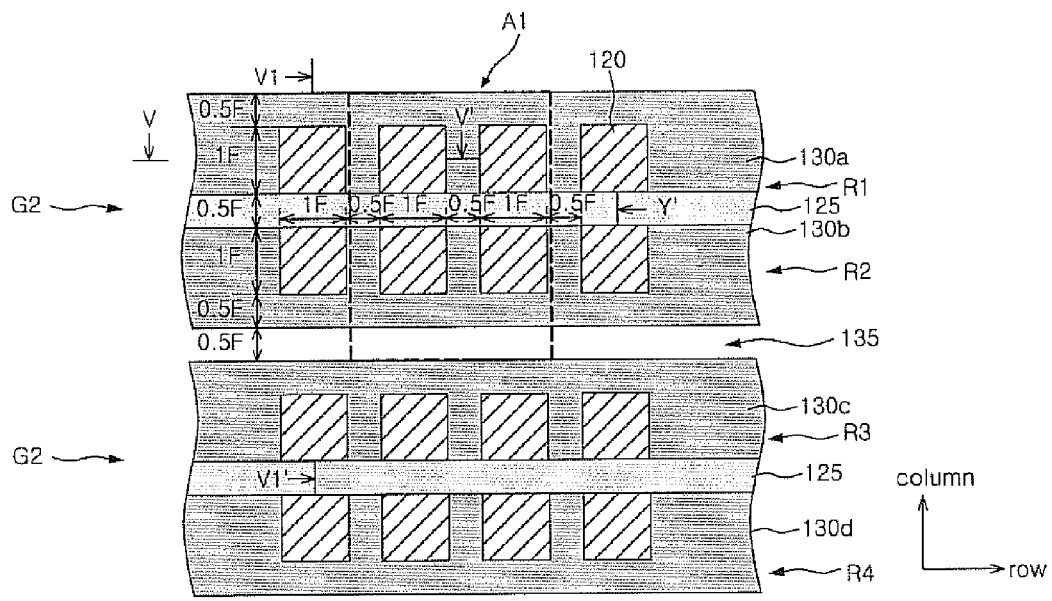
FIG. 4 is a layout diagram schematically illustrating a variable resistive memory device according to an embodiment of the inventive concept.

FIG. 4 is a schematic layout diagram illustrating a memory cell array of a variable resistive memory device according to an embodiment.

Referring to FIG. 4, a memory cell array 1000 of a variable resistive memory device includes a plurality of active pillars 120 arranged with a constant rule in a column direction and a row direction.

Each of the plurality of active pillars 120 may protrude from an upper surface of a semiconductor substrate. Each active pillar 120 may have a rectangular pillar having a size of 1 F by 1 F. The active pillar 120 is a region including a channel of a transistor serving as an access device and a variable resistor functioning as a data storage. Therefore, the active pillar 120 may be interpreted as a unit memory cell.

The active pillar 120 is arranged in two adjacent columns R1 and R2 form one group G1. Another active pillar 120 is arranged in two adjacent columns R3 and R4 form the other group G2. For example, the active pillars 120 included in each of the group G1 and G2 are separated from each other by a distance of 0.5 F in column and row directions.

Two active pillars included in different groups G1 and G2 and adjacently arranged in the same row may be spaced from each other by a distance of 1.5 F, because of a line width of a word line to be formed later.

An inter-pattern insulating layer 125 may be interposed between the active pillars 120 arranged in the two rows R1 and R2 of the same group G1 or the two rows R3 and R4 of the same group G2. The inter-pattern insulating layer 125 may substantially have the same height (thickness) as those of the active pillars 120 adjacent thereto.

Word lines 130a to 130d are formed every column R1 to R4 where the active pillars 120 are arranged to surround the active pillars 120 arranged in the same column. At this time, a pair of word lines 130a and 130b included in the same group G1 and a pair of word lines 130c and 130d included in the same group G2 may be arranged to be symmetrical with the inter-pattern insulating layer 125 interposed therebetween. Therefore, the pair of word lines 130a and 130b of the two rows R1 and R2 included in the same group G1 and the pair of word lines 130c and 130d of the two word lines R3 and R4 included in the same group G2 may be insulated by the inter-pattern insulating layer 125, while the word lines 130b and 130c of two rows R2 and R3 included in the different groups G1 and G2 may be insulated from each other by an interlayer insulating layer 135.

Further, the pair of word lines 130a and 130b of the two rows R1 and R2 included in the same group G1 and the pair of word lines 130c and 130d of the two rows R3 and R4 included in the same group G2 may surround only three sides of the active pillars 120. The pair of word lines 130a and 130b in the two rows R1 and R2 included in the same group G1 and the pair of word lines 130c and 130d in the two rows R3 and R4 included in the same group G2 are in contact with the inter-pattern insulating layer 125.

That is, the word lines 130a to 130d may have line widths of 1.5 F and may be arranged in a distance of 0.5 F. The inter-pattern insulating layer 125 is interposed between the pair of word lines 130a and 130b included in the same group G1 and the pair of word lines 130c and 130d included in the same group G2. The pair of word lines 130a and 130b is insulated from each other. The pair of word lines 130c and 130d is insulated from each other. Further, the active pillars 120 are arranged at a contact interface between the word lines 130a to 130d and the inter-pattern insulating layer 125. One side of each of the pillars 120 is in contact with the inter-pattern insulating layer 125 and the other sides of each of the pillars 120 are surrounded by the word lines 130a to 130d.

A gate insulating layer (not shown) may be interposed between the word lines 130a to 130d and the active pillars 120. Further, the word lines 130a to 130d may be formed to have heights lower than those of the active pillars 120.

Figure 5:
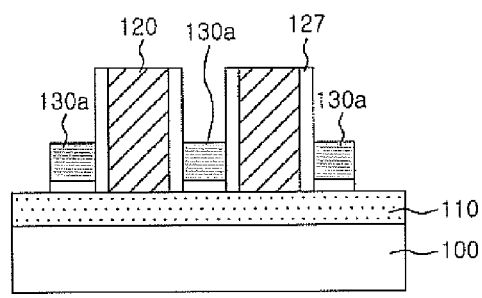
FIG. 5 is a cross-sectional view of the variable resistive memory device taken along a line V-V' shown in FIG. 4.
Figure 6:
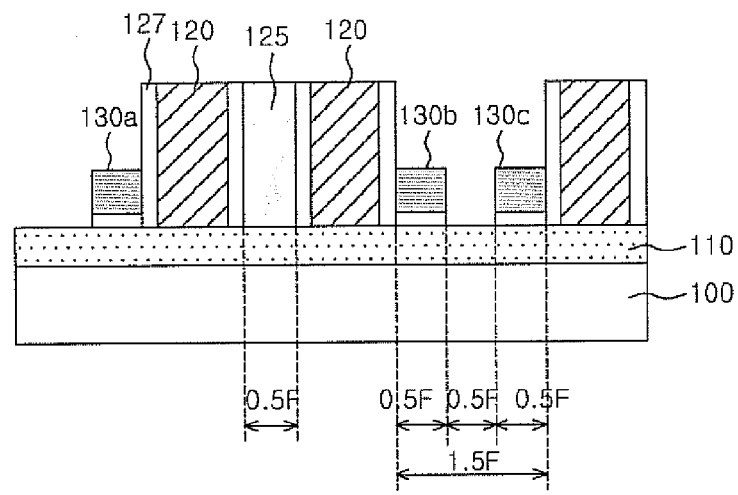
FIG. 6 is a cross-sectional view of the variable resistive memory device taken along a line VI-VI' shown in FIG. 4.

FIG. 5 is a cross-sectional view of the memory cell array taken along a line V-V' of FIG. 4. FIG. 6 is a cross-sectional view of the memory cell array taken along a line VI-VI' of FIG. 4.

Referring to FIGS. 5 and 6, a common source 110 is formed on a semiconductor substrate 100. The active Pillars 120 having a pattern shape are formed on the common source 110 and the word lines 130a to 130c are formed on sidewalls of the active pillars 120.

A gate insulating layer 127 may be interposed between the active pillars 120 and the word lines 13 and between the word lines 130a to 130c and the common source 110.

When viewed in a cross-section of FIG. 5, the word line 130a is arranged between the active pillars 120 arranged in the same column.

When viewed in a cross-section of FIG. 6, the active pillars 120 in the same row included in the same group are spaced from each other on the basis of the inter-pattern insulating layer having a line width of 0.5 F.

The active pillars 120 adjacent to each other in the same row included in the different groups G1 and G2 are spaced from each other by a distance of 1.5 F. The word lines 130b and 130c adjacent to each other included in the different groups are spaced from each other by a distance of 1 F.

As Table below, in the memory cell array 1000 of the variable resistive memory device according to the embodiment, an arrangement of four active pillars 120 (unit memory cell A1) is 12 $F^2$. The area may be reduced by 3 $F^2$ compared with an area 15 $F^2$ of four unit memory cells A0 (see FIG. 1) in the related art.

TABLE

|  | Area |
|---|---|
| In this embodiment | 3F * 4F = $12F^2$ |
| In the related art | 3F * 5F = $15F^2$ |

That is, the surround gate structure of the embodiment, the word lines surround some sides of the active pillars to reduce a layout area of the variable resistive memory device.

Figure 7:
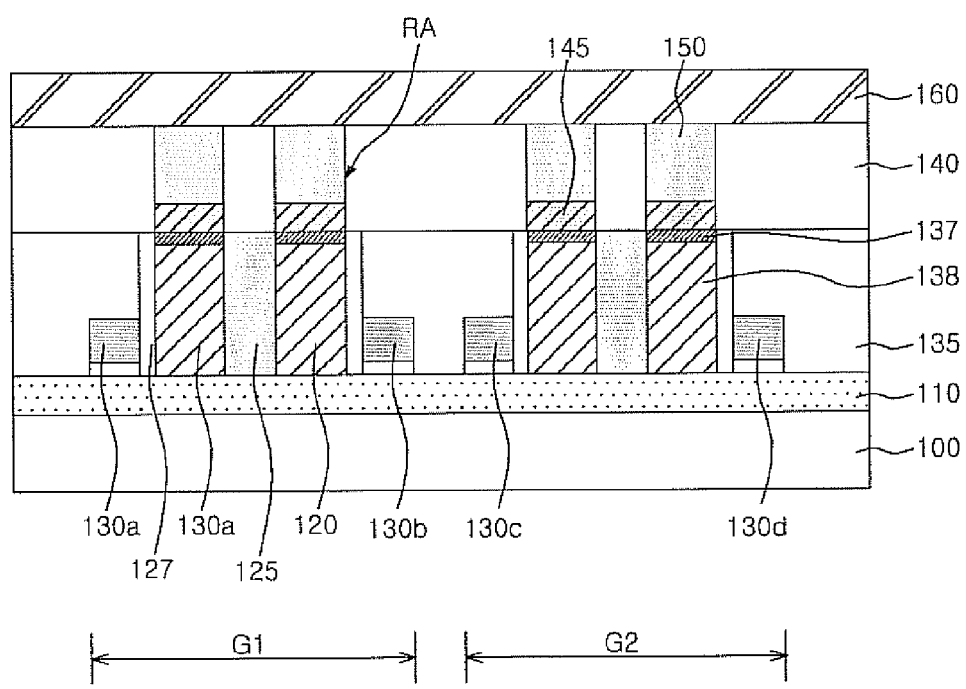
FIG. 7 is a cross-sectional view illustrating a variable resistive memory device according to another embodiment.

FIG. 7 is a cross-sectional view illustrating a variable resistive memory device according to another embodiment.

Referring to FIG. 7, a first interlayer insulating layer 135 is formed on a semiconductor substrate where word lines 130a to 130d are insulated from each other. The first interlayer insulating layer 135 may expose upper surfaces of active pillars 120. A drain 138 is formed on each of the exposed active pillars 120. Here, a numeric reference 139 directs to an ohmic contact layer.

A second interlayer insulating layer 140 is formed on the first interlayer insulating layer 135. A variable resistive space RA may expose each of the drains 138.

A heating electrode 145 is formed on a lower portion of each of the variable resistive spaces RA to connect with the drain 138. A variable resistive layer 150 is formed on the heating electrode 145 to be filled within the variable resistive space RA. The variable resistive layer 150 may include a PCMO layer as a resistive memory material, a chalcogenide layer as a phase-change memory material, a magnetic layer as a magnetic memory material, a magnetization switching device layer as a spin transfer torque memory random access memory (STTMRAM) material, or a polymer layer as a polymer memory material.

A bit line 160 is formed on the second interlayer insulating layer 140 to be connected to the variable resistive layer 150. The bit line 160 may extend in a direction crossing the word lines 130a to 130d (for example, the column direction of FIG. 4).

Figure 8A:
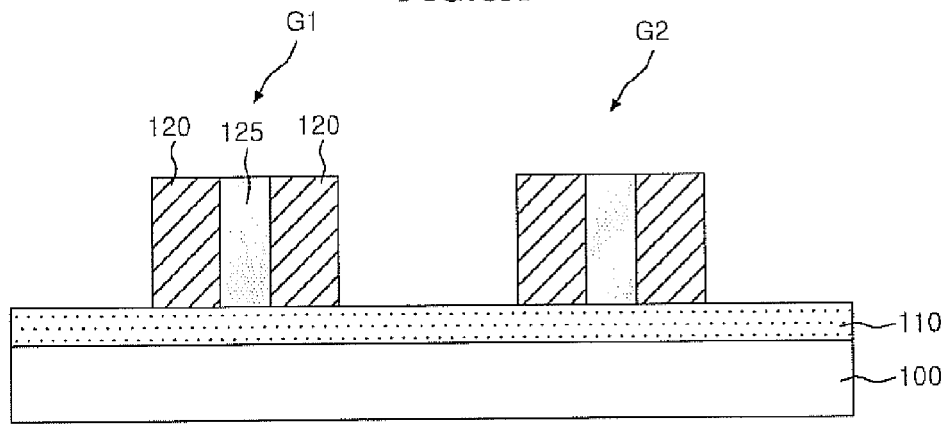
FIGS. 8A and 8B are cross-section views for processes illustrating a method of fabricating a variable resistive memory device according to an embodiment of the inventive concept.
Figure 8B:
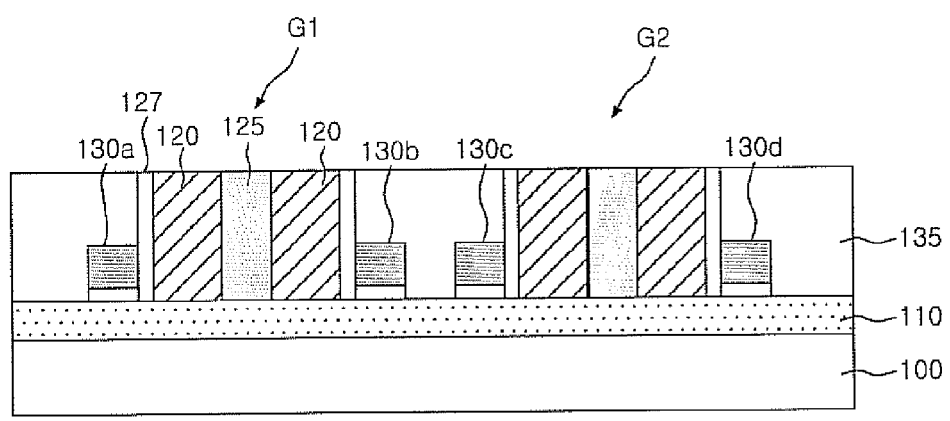

FIGS. 8A and 8B are cross-sectional views illustrating a method of fabricating a variable resistive memory cell array according to an embodiment.

Referring to FIG. 8A, a common source 110 is formed on a semiconductor substrate 100. The common source 110 may be formed for groups or columns and may be formed of a type of an impurity region or a conductive layer.

An active layer is deposited on the semiconductor layer 100 including the source 110 and then patterned in a predetermined pattern to define active pillars 120. The active layer may include, for example, a semiconductor layer such as polysilicon. Next, an inter-pattern insulating layer 125 is deposited to be filled within the active pillars 120 and then etched to remain between active pillars 120 included in the same group.

Referring to FIG. 8B, a gate insulating layer 127 and a conductive layer are formed along surfaces of the active pillars 120 and the common source 110 and anisotropically etched. Therefore, word lines 130a to 130d are formed to surround sidewalls of the active pillars 120. Next, a first interlayer insulating layer 135 is deposited to insulate the word lines 130a to 130d from each other and the planarized to form the memory cell array.

According to the embodiments, the inter-pattern insulating layer is interposed between the pair of word lines constituting the one group and the active pillars are arranged at intervals at a contact surface between the inter-pattern insulating layer and the word lines. Accordingly, an area can be reduced by a line width of the word line surrounding one side of the active pillar. Thus, a layout area of the cell area can be reduced.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A memory cell array, comprising:
    a pair of word lines;
    an inter-pattern insulating layer interposed between the pair of word lines; and
    a plurality of active pillars, each having one side contacted with the inter-pattern insulating layer and other sides surrounded by the word line.

2. The memory cell array of claim 1, further comprising:
    a plurality of memory groups, each including a plurality of the pairs of word lines and the plurality of active pillars arranged in a matrix,
    wherein the plurality of memory groups is arranged in a direction parallel to each other with a predetermined gap.

3. The memory cell array of claim 2, wherein the active pillar has a rectangular pillar shape.

4. The memory cell array of claim 3, wherein the sides of the active pillar have a first line width which corresponds to a critical dimension.

5. The memory cell array of claim 4, wherein the plurality of active pillars surrounded by each of the pair of word lines are spaced from each other by a distance corresponding to ½ of the first line width.

6. The memory cell array of claim 4, wherein a line width of the inter-pattern insulating layer arranged between the pair of word lines corresponds ½ of the first line width.

7. The memory cell array of claim 4, wherein the plurality of memory groups is separated from each other by a predetermined distance corresponding to ½ of the first line width.

8. A memory cell array, comprising:
    a first memory group including a first word line, a second word line adjacent to the first word line and extending parallel to the first word line, a first inter-pattern insulating layer interposed between the first and second word lines, a plurality of first active pillars arranged between the first word line and the first inter-pattern insulating layer in a first rule, and a plurality of second active pillars formed between the second word line and the first inter-pattern insulating layer in the first rule to correspond to the plurality of first active pillars; and
    a second memory group including a third word line adjacent to the second word line and extending parallel to the second word line, a fourth word line adjacent to the third word line and extending parallel to the third word line, a second inter-pattern insulating layer interposed between the third and fourth word lines, a plurality of third active pillars arranged between the third word line and the second inter-pattern insulating layer in the first rule, and a plurality of fourth active pillars formed between the fourth word line and the second inter-pattern insulating layer in the first rule to correspond to the plurality of third active pillars.

9. The memory cell array of claim 8, wherein a size of contact between one of the pluralities of the first and second active pillars and the first inter-pattern insulating layer or a size of contact between one of the pluralities of the third and fourth active pillars and the second inter-pattern insulating layer corresponds to a first length.

10. The memory cell array of claim 9, wherein the first to fourth word lines are spaced from each other by a distance corresponding to ½ of the first length.

11. The memory cell array of claim 8, wherein one side of each of the pluralities of the first and second active pillars is in contact with the first inter-pattern insulating layer and remaining other sides are surrounded by the first or second word line.

12. The memory cell array of claim 8, wherein one side of each of the pluralities of the third and fourth active pillars is in contact with the second inter-pattern insulating layer and remaining other sides are surrounded by the third or fourth word line.

13. A variable resistive memory device, comprising:
a first word line;
a second word line, arranged in a direction parallel to the first word line, and spaced from the first word line by a first length corresponding to a half of critical dimension;
an inter-pattern insulating layer between the first and second word lines;
a plurality of first active pillars surrounded by the first word line and the inter-pattern insulating layer, and arranged at intervals of the first length;
a plurality of second active pillars surrounded by the second word line and the inter-pattern insulating layer, and arranged at intervals of the first length to correspond to the plurality of first active pillars; and
a plurality of variable resistive bodies arranged on the pluralities of the first and second active pillars and electrically connected to the first and second active pillars.

14. The variable resistive memory device of claim 13, wherein the pluralities of first and second active pillars are configured that one side of the pluralities of first and second active pillars is in contact with the inter-pattern insulating layer, and remaining three sides of the pluralities of first and second active pillars are surrounded by the first or second word line.

15. The variable resistive memory device of claim 14, wherein each of the pluralities of first and second active pillars has a rectangular pillar shape,
the active pillars are configured that one sides of the pluralities of first and second active pillars are in contact with the inter-pattern insulating layer, and remaining three sides of the pluralities of first and second active pillars are surrounded by the first or second word line.

16. The variable resistive memory device of claim 13, wherein the first and second word lines are formed to have heights lower than the pluralities of first and second active pillars.

17. The variable resistive memory device of claim 13, further comprising:
a third word line adjacent to the second word line and arranged parallel to the second word line;
a fourth word line adjacent to the third word line and arranged parallel to the third word line;
an additional inter-pattern insulating layer between the third and fourth word lines;
a plurality of third active pillars arranged between the third word line and the additional inter-pattern insulating layer in a distance of ½ of the first length; and
a plurality of fourth active pillars formed between the fourth word line and the additional inter-pattern insulating layer in the distance of ½ of the first length to correspond to the plurality of third active pillars.

18. The variable resistive memory device of claim 17, further comprising variable resistive bodies formed on the pluralities of the third and fourth active pillars.

19. The variable resistive memory device of claim 18, further comprising drains arranged between the pluralities of first to fourth active pillars and the variable resistive bodies.

20. The variable resistive memory device of claim 19, wherein the semiconductor substrate further includes a common source electrically connected to the pluralities of first to fourth active pillars.

* * * * *